(12) United States Patent
Yu

(10) Patent No.: US 6,284,630 B1
(45) Date of Patent: Sep. 4, 2001

(54) METHOD FOR FABRICATION OF ABRUPT DRAIN AND SOURCE EXTENSIONS FOR A FIELD EFFECT TRANSISTOR

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/421,304

(22) Filed: Oct. 20, 1999

(51) Int. Cl.[7] ........................................ H01L 21/04
(52) U.S. Cl. ..................... 438/511; 438/525; 438/181
(58) Field of Search ............................. 438/197, 161, 438/181, 299, 511, 525

(56) References Cited

U.S. PATENT DOCUMENTS

| | | | |
|---|---|---|---|
| 5,223,445 | * | 6/1993 | Fuse ................................... 438/302 |
| 5,908,307 | * | 6/1999 | Talwar et al. ....................... 438/199 |
| 6,153,455 | * | 11/2000 | Ling et al. .......................... 438/231 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 57–58, 397–399.*

Somit Talwar, Gaurav Verma, and Kurt H. Weiner, Ultra–Shallow, Abrupt, and Highly–Activated Junctions by Low–Energy Ion Implantation and Laser Annealing, SPIE, 1998, pp. 74–77.

Yuan Taur, Clement H. Wann, and David J. Frank, 25 nm CMOS Design Considerations, IEDM, 1998, pp. 789–792.

Semiconductor Industry Association, *The National Technology Roadmap for Semiconductors*, 1997.

* cited by examiner

Primary Examiner—Charles Bowers
Assistant Examiner—William M. Brewster
(74) Attorney, Agent, or Firm—Monica H. Choi

(57) ABSTRACT

Drain and source extensions that are abrupt and shallow and that have high concentration of dopant are fabricated for a field effect transistor, using a laser thermal process. A drain amorphous region is formed by implanting a neutral species into a drain region of the field effect transistor at an angle directed toward a gate of the field effect transistor such that the drain amorphous region is a trapezoidal shape that extends to be sufficiently under the gate of the field effect transistor. A source amorphous region is formed by implanting the neutral species into a source region of the field effect transistor at an angle directed toward the gate of the field effect transistor such that the source amorphous region is a trapezoidal shape that extends to be sufficiently under the gate of the field effect transistor. A drain and source dopant is implanted into the drain and source amorphous regions at an angle directed toward the gate of the field effect transistor. A laser beam is then applied to the drain and source amorphous regions such that the drain and source dopant is activated within the drain and source amorphous regions in a laser thermal process. The drain and source extensions are formed by the activation of the drain and source dopant in the drain and source amorphous regions respectively during the laser thermal process. The trapezoidal shape of the drain and source extensions minimizes the series resistance and the leakage current in the field effect transistor having scaled down dimensions.

14 Claims, 3 Drawing Sheets

METHOD FOR FABRICATION OF ABRUPT DRAIN AND SOURCE EXTENSIONS FOR A FIELD EFFECT TRANSISTOR

TECHNICAL FIELD

The present invention relates generally to fabrication of field effect transistors having scaled-down dimensions, and more particularly, to a method for fabricating abrupt drain and source extensions of a field effect transistor by forming trapezoidal drain and source amorphous regions that extend sufficiently under the gate of the field effect transistor before using a laser thermal process.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be a polysilicon gate. A gate silicide 120 is formed on the polysilicon gate 118 for providing contact to the polysilicon gate 118. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the polysilicon gate 118 and the gate oxide 116. When the spacer 122 is comprised of silicon nitride (SiN), then a spacer liner oxide 124 is deposited as a buffer layer between the spacer 122 and the sidewalls of the polysilicon gate 118 and the gate oxide 116.

Referring to FIG. 1, dopant implanted into the drain contact junction 108 and the source contact junction 112, which are deeper junctions, and the gate structure 118 are activated typically using a RTA (Rapid Thermal Anneal) process at a relatively higher temperature such as at temperatures greater than 1000° Celsius, for example, as known to one of ordinary skill in the art of integrated circuit fabrication. Such higher temperature activation in the deeper drain and source contact junctions 108 and 112 reduces silicide to contact junction resistance. In addition, such higher temperature activation in the gate structure 118 reduces poly-depletion effect within the gate structure 118 such that the speed performance of the MOSFET 100 is enhanced, as known to one of ordinary skill in the art of integrated circuit fabrication.

In contrast, as dimensions of the MOSFET 100 are scaled further down to tens of nanometers, the drain extension 104 and the source extension 106 are desired to be abrupt and shallow junctions to minimize short-channel effects of the MOSFET 100, as known to one of ordinary skill in the art of integrated circuit fabrication. In addition, for enhancing the speed performance of the MOSFET 100 with scaled down dimensions, a high dopant concentration in the drain extension 104 and the source extension 106 is desired.

In the prior art, dopant within the drain extension 104 and the source extension 106 are activated using a RTA (Rapid Thermal Anneal) process at a relatively lower temperature such as at temperatures less than 1000° Celsius, for example, as known to one of ordinary skill in the art of integrated circuit fabrication. However, as dimensions of the MOSFET 100 are further scaled down, a RTA process is disadvantageous because thermal diffusion of the dopant within the drain extension 104 and the source extension 106 causes the drain extension 104 and the source extension 106 to become less shallow. In addition, with a RTA process, the concentration of the dopant within the drain extension 104 and the source extension 106 is limited by the solid solubility of the dopant within the drain extension 104 and the source extension 106, as known to one of ordinary skill in the art of integrated circuit fabrication.

Because of such limitations of using a RTA process to activate dopant within the drain extension 104 and the source extension 106, a laser thermal process is proposed in the technical journal article, *Ultra-Shallow, Abrupt, and Highly-Activated Junctions by Low-Energy Ion Implantation and Laser Annealing* by Somit Talwar et al., SPIE 1998, pages 74–77. In such a laser thermal process, the dopant within the drain extension 104 and the source extension 106 is activated by directing a laser beam toward the drain extension 104 and the source extension 106.

Activation by such a laser thermal process is advantageous because the time period for heating the drain extension 104 and the source extension 106 is on the order of a few nanoseconds (which is approximately eight orders of magnitude shorter than a RTA process). Thus, thermal diffusion of dopant within the drain extension 104 and the source extension 106 is negligible such that the drain extension 104 and the source extension 106 remain shallow, as known to one of ordinary skill in the art of integrated circuit fabrication.

In addition, because the semiconductor material forming the drain extension 104 and the source extension 106 becomes molten and then recrystallizes, the drain extension 104 and the source extension 106 formed by activation using the laser thermal process is an abrupt junction. Furthermore, because the melting and recrystallization time period is on the order of hundreds of nanoseconds, the activated dopant concentration within the drain extension 104 and the source extension 106 is well above the solid solubility, as known to one of ordinary skill in the art of integrated circuit fabrication.

Despite such advantages of the laser thermal process, the drain extension 104 and the source extension 106 formed using the laser thermal process may also have several disadvantageous features. Referring to FIG. 2, a MOSFET 200 has a drain extension 130 and a source extension 132 formed by using the laser thermal process. (Elements having the same reference number in FIGS. 1 and 2 refer to elements having similar structure and function.)

For forming the drain extension 130 and the source extension 132, the spacer 122 is etched. However, the spacer liner oxide 124 which is relatively thin (typically in the range of 100 Å (angstroms) to 200 Å (angstroms) for example), typically remains on the sidewalls of the gate structure 118. Because the drain extension 130 and the source extension 132 formed by activation using the laser thermal process is an abrupt junction, the drain extension 130 and the source extension 132 may not sufficiently extend under the gate structure 118 because of the off-set from the spacer liner oxide 124 remaining on the sidewalls of the gate structure 118. Such insufficient overlap of the gate structure 118 over the drain extension 130 and the source extension 132 results in large series resistance at the drain and source of the MOSFET 200 and in degradation of the speed performance of the MOSFET 200.

Furthermore, because the drain extension 130 and the source extension 132 formed by activation using the laser thermal process is an abrupt junction, as the channel length of the MOSFET 200 is scaled down to tens of nanometers, subsurface punch-through effects in the channel region 134 of the MOSFET 200 results in leakage current in the MOSFET 200.

Nevertheless, as the MOSFET is further scaled down, a laser thermal process for activating dopant in the drain extension and the source extension of the MOSFET is desired for fabrication of drain and source extensions that are shallow and abrupt junctions with high concentration of dopant. Thus, a process is desired for fabricating shallow and abrupt drain and source extensions with high concentration of dopant using the laser thermal process while at the same time minimizing the high series resistance at the drain and source of the MOSFET and minimizing the high leakage current that may result.

SUMMARY OF THE INVENTION

Accordingly, in a general aspect of the present invention, drain and source extensions that are abrupt and shallow and that have high concentration of dopant are fabricated using a laser thermal process with minimization of series resistance at the drain and source and with minimization of leakage current in a MOSFET.

In one embodiment of the present invention, a drain amorphous region is formed by implanting a neutral species into a drain region of the field effect transistor at an angle directed toward a gate of the field effect transistor such that the drain amorphous region is a trapezoidal shape that extends to be sufficiently under the gate of the field effect transistor. A source amorphous region is formed by implanting the neutral species into a source region of the field effect transistor at an angle directed toward the gate of the field effect transistor such that the source amorphous region is a trapezoidal shape that extends to be sufficiently under the gate of the field effect transistor. A drain and source dopant is implanted into the drain and source amorphous regions at an angle directed toward the gate of the field effect transistor. A laser beam is then applied to the drain and source amorphous regions such that the drain and source dopant is activated within the drain and source amorphous regions in a laser thermal process. The drain extension and the source extension are formed by the activation of the drain and source dopant in the drain amorphous region and the source amorphous region respectively, during the laser thermal process.

In this manner, implantation of the neutral species to form the drain amorphous region and the source amorphous region lowers the melting temperature of such regions. Thus, when the laser beam is applied to such regions, substantially only the drain amorphous region and the source amorphous region having the neutral species implanted therein melts and recrystallizes for activation of the source and drain dopant therein to form the drain extension and the source extension of the field effect transistor of the present invention.

By implanting the neutral species and the drain and source dopant at an angle, the drain amorphous region and the source amorphous region are formed into substantially a trapezoidal shape with the top of the drain amorphous region and the source amorphous region extending more inward toward the channel region of the MOSFET. Thus, the drain extension and the source extension formed from the drain and source amorphous regions extends sufficiently under the gate structure of the MOSFET such that series resistance at the drain and source of the MOSFET is minimized. In addition, because the drain extension and the source extension are substantially a trapezoidal shape, leakage current from subsurface punch-through in the channel region of the MOSFET is also minimized.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, and 8 refer to elements having similar structure and function.

DETAILED DESCRIPTION

Figure 1:
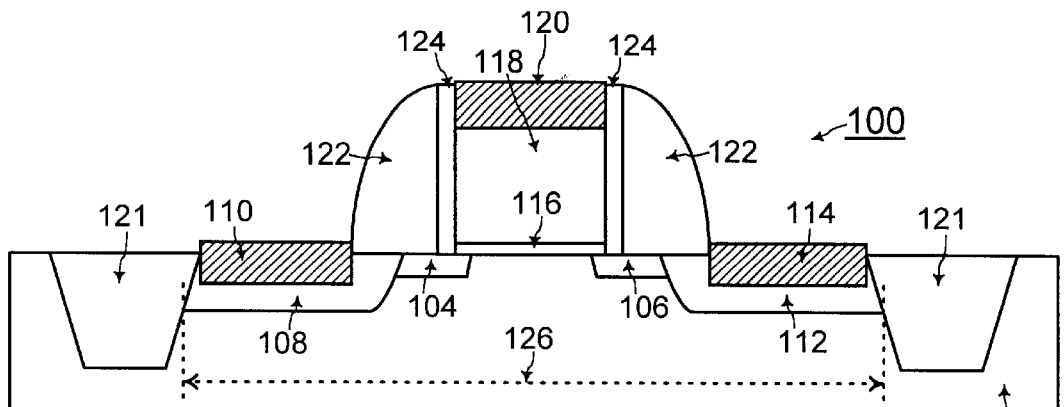
FIG. 1 shows a cross-sectional view of a MOSFET (Metal Oxide Semiconductor Field Effect Transistor) having drain and source contact junctions and drain and source extension implants.
Figure 2:
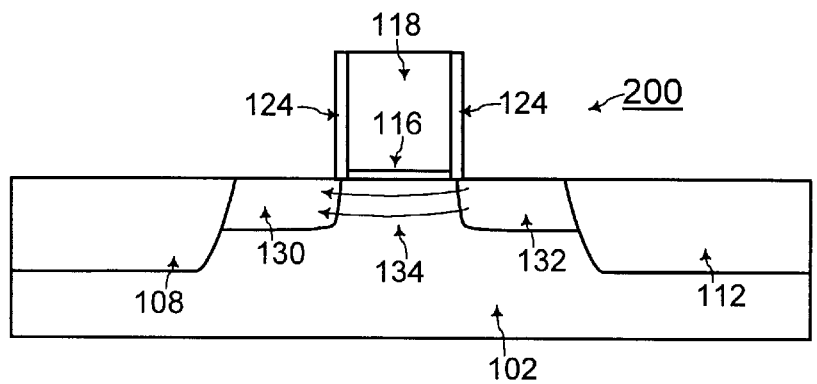
FIG. 2 shows a cross-sectional view of a MOSFET of the prior art having a drain extension and a source extension formed by using a laser thermal process with insufficient extension of the drain and source extensions under the gate of the MOSFET and with subsurface punch-through effect in the channel region of the MOSFET.
Figure 3:
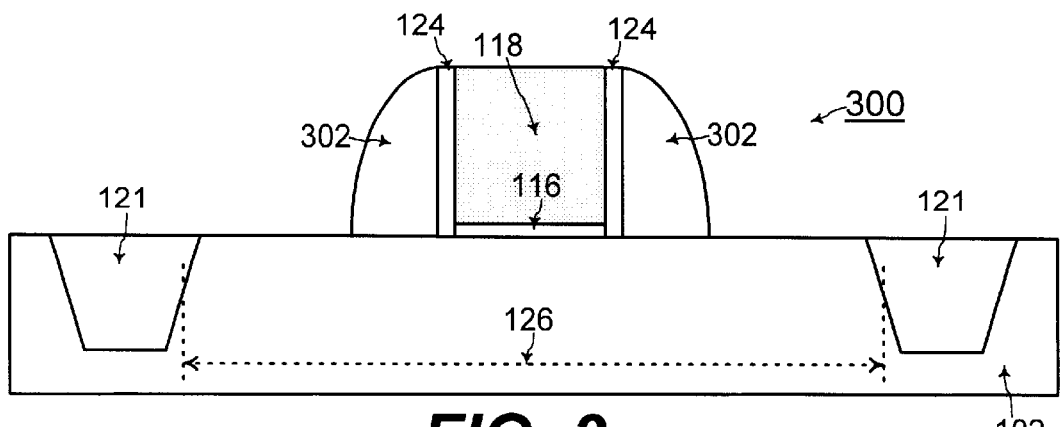
FIGS. 3, 4, 5, 6, 7, and 8 show cross-sectional views of a MOSFET fabricated according to the present invention for illustrating the steps for formation of drain and source extensions using a laser thermal process while at the same time minimizing series resistance at the drain and source and leakage current in such a MOSFET.

Referring to FIG. 3, in a general aspect of the present invention, a MOSFET (Metal Oxide Semiconductor Field Effect Transistor) 300 of the present invention having shallow and abrupt drain and source extensions is fabricated using a laser thermal process with minimization of series resistance at the drain and source and with minimization of leakage current in such a MOSFET 300. Referring to FIG. 3, a spacer 302 is deposited on the sidewalls of the gate structure 118 of the MOSFET 300. When the spacer 302 is comprised of silicon nitride (SiN), a spacer liner oxide 124 is deposited as a buffer layer between the spacer 302 and the sidewalls of the polysilicon gate 118 and the gate oxide 116. Processes for fabrication of the spacer 302 and the spacer liner oxide 124 are known to one of ordinary skill in the art of integrated circuit fabrication.

Figure 4:
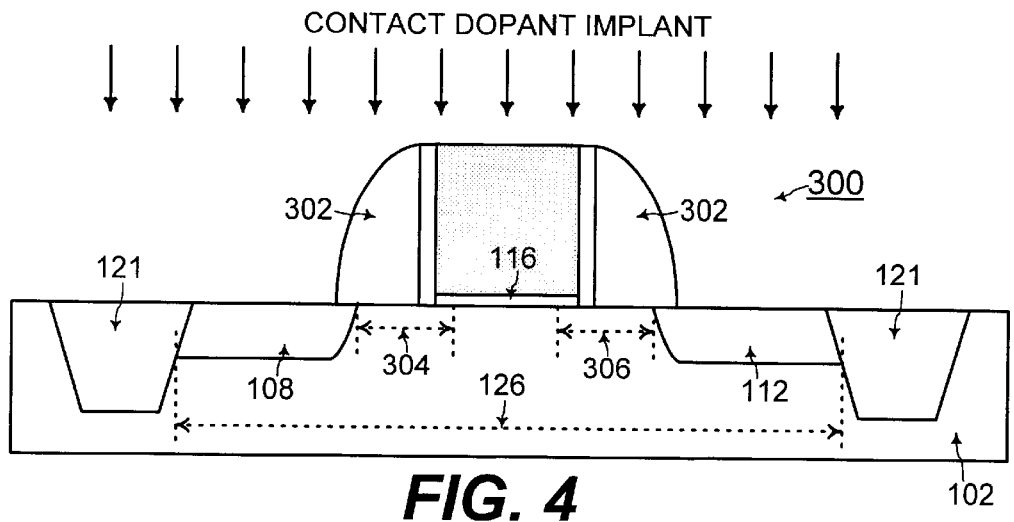

Referring to FIG. 4, while the spacer 302 covers a drain region 304 and a source region 306 in the active device area 126, contact dopant is implanted into the exposed portions of the active device area 126 of the semiconductor substrate 102 to form the drain contact junction 108 and the source contact junction 112. The drain contact junction 108 and the source contact junction 112 are deeper junctions such that a relatively large silicide may be fabricated therein to provide low resistance contact to the drain and the source respectively of the MOSFET 300. Thus, the contact dopant within the drain contact junction 108 and the source contact junction 112 is then activated by using a RTA (Rapid Thermal Anneal) process at a relatively high temperature which may be in a range of 1050° Celsius to 1100° Celsius for example in one embodiment of the present invention. Processes for such implantation and activation of the contact dopant within the drain contact junction 108 and the source contact junction 112 are known to one of ordinary skill in the art of integrated circuit fabrication.

Figure 5:
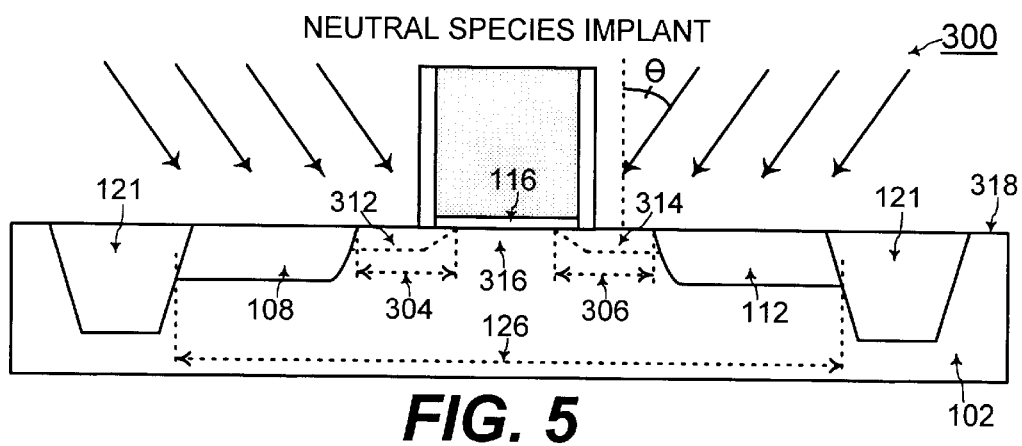

Referring to FIG. 5, after formation of the drain contact junction 108 and the source contact junction 112, the spacer 302 is removed from the sidewalls of the gate structure 118. Because the spacer liner oxide 124 is relatively thin (typically in the range of 100 Å (angstroms) to 200 Å (angstroms) for example), the spacer liner oxide 124 remains on the sidewalls of the gate structure 118. The etching of the spacer 302 results in exposure of the drain region 304 and the source region 306. Processes for such etching of the spacer 302 are known to one of ordinary skill in the art of integrated circuit fabrication.

Referring to FIG. 5, in order to ensure that the drain extension and the source extension sufficiently extends to be under the gate structure 118 in the MOSFET 300 despite the spacer liner oxide 124 remaining on the sidewalls of the gate structure 118, a neutral species is implanted into the drain region 304 and the source region 306 at an angle of $\theta$ with respect to an axis that is perpendicular to the surface of the semiconductor substrate 102. For a large angle tilted implant, the angle, $\theta$, may be in a range of approximately 30° to 60° in one embodiment of the present invention for example.

The neutral species is implanted with the large angle tilt toward the gate structure 118 of the MOSFET 300 such that a drain amorphous region 312 and a source amorphous region 314 that form as a result of such an implant is substantially a trapezoidal shape as shown in FIG. 5. With such a trapezoidal shape, the drain amorphous region 312 and the source amorphous region 314 extend inward toward a channel region 316 of the MOSFET 300 more toward a top surface 318 of the semiconductor substrate 102 such that the drain amorphous region 312 and the source amorphous region 314 sufficiently extends to be under the gate structure 118.

Implantation of the neutral species for formation of the drain amorphous region 312 and the source amorphous region 314 lowers the melting temperature of the drain amorphous region 312 and the source amorphous region 314. Examples of such neutral species include ionized silicon (Si$^+$), ionized germanium (Ge$^+$), or ionized xenon (Xe$^+$), for example.

Figure 6:
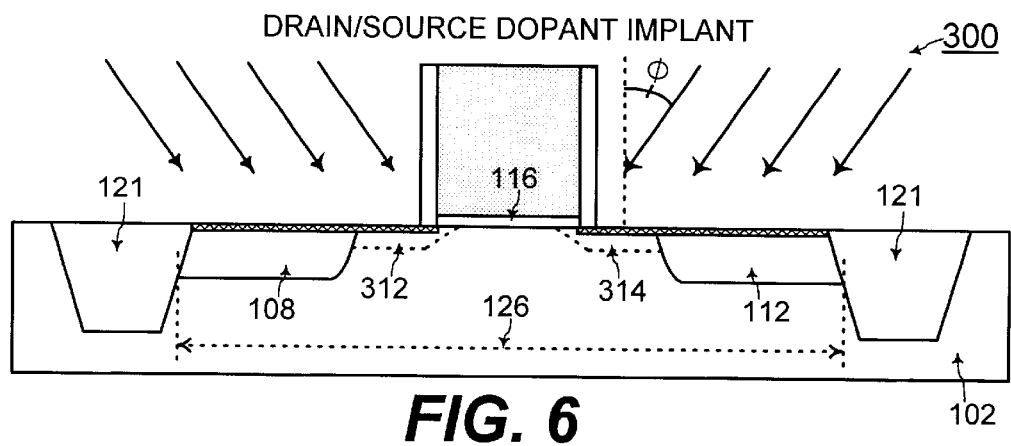

Referring to FIG. 6, a drain and source dopant is then implanted into the drain amorphous region 312 and the source amorphous region 314 at an angle of $\phi$ with respect to an axis that is perpendicular to the surface of the semiconductor substrate 102. For a large angle tilted implant, the angle, $\phi$, may be in a range of approximately 30° to 60° in one embodiment of the present invention for example. The drain and source dopant is an N-type dopant when the MOSFET 300 is an NMOSFET (N-channel Metal Oxide Semiconductor Field Effect Transistor). Alternatively, the drain and source dopant is a P-type dopant when the MOSFET 300 is a PMOSFET (P-channel Metal Oxide Semiconductor Field Effect Transistor).

Figure 7:
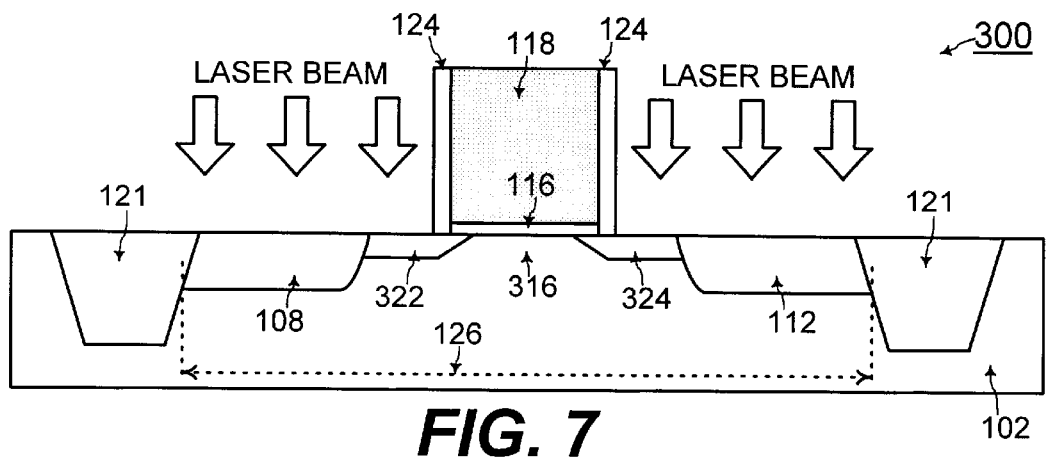

Referring to FIGS. 6 and 7, a laser beam is applied to the drain amorphous region 312 and the source amorphous region 314 to activate the drain and source dopant in the drain amorphous region 312 and the source amorphous region 314 in a laser thermal process as known to one of ordinary skill in the art of integrated circuit fabrication. The drain amorphous region 312 and the source amorphous region 314 having the neutral species implanted therein has a lower melting temperature within the active device region of the semiconductor substrate 102. Thus, when the laser beam is applied onto the active device area 126 of the semiconductor substrate 102, the drain amorphous region 312 and the source amorphous region 314 melt and recrystallize to form a drain extension 322 and a source extension 324.

Referring to FIGS. 6 and 7, the drain extension 322 is formed from activation of the drain and source dopant within the drain amorphous region 312 that melts and recrystallizes during the laser themal process. Similarly, the source extension 324 is formed from activation of the drain and source dopant within the source amorphous region 314 that melts and recrystallizes during the laser themal process. Thus, the drain extension 322 and the source extension 324 assume the trapezoidal shape of the drain amorphous region 312 and the source amorphous region 314, respectively.

Referring to FIG. 6, in one embodiment of the present invention, the depth of implantation of the drain and source dopant into each of the drain amorphous region 312 and the source amorphous region 314 is less than half the depth of each of the drain amorphous region 312 and the source amorphous region 314 before the laser beam is applied in the laser thermal process. With such a shallow implantation of the drain and source dopant, a substantial portion (such as 90% for example) of the drain and source dopant may be contained within the drain amorphous region 312 and the source amorphous region 314 during and after the laser thermal process.

Figure 8:
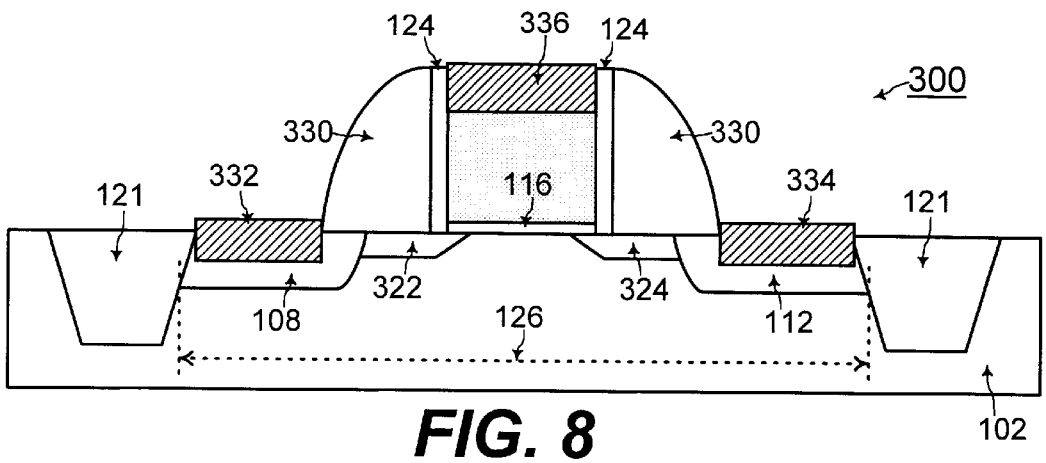

Referring to FIG. 8, a spacer 330 is then fabricated on the sidewalls of the gate structure 118, and such a spacer 330 may be comprised of silicon nitride (SiN). Furthermore, a drain silicide 332 is formed with the drain contact junction 108 for providing contact to the drain of the MOSFET 300, and a source silicide 334 is formed with the source contact junction 112 for providing contact to the source of the MOSFET 300. A gate silicide 336 is formed with the gate structure 118 for providing contact to the gate of the MOSFET 300. Such silicides may be comprised of one of cobalt silicide (CoSi$_2$) or titanium silicide (TiSi$_2$) for example, and processes for formation of such silicides are known to one of ordinary skill in the art of integrated circuit fabrication.

In this manner, by using large angle tilted implantation of the neutral species for formation of the drain and source amorphous regions 312 and 314, drain and source extensions 322 and 324 having a substantially trapezoidal shape are formed for the MOSFET 300 of the present invention. With such a trapezoidal shape, the drain and source extensions 322 and 324 extend to be sufficiently under the gate structure 118 toward the top surface 318 of semiconductor substrate for the MOSFET 300 of the present invention. With such sufficient overlap of the gate structure 118 over the drain and source extensions 322 and 324, series resistance at the drain and source of the MOSFET 300 is minimized.

Furthermore, with such a trapezoidal shape of the drain and source extensions 322 and 324, the distance between the drain and source extensions 322 and 324 increases toward the bottom of the semiconductor substrate 102. With such increased distance, subsurface punch-through effect in the channel region 316 and thus leakage current in the MOSFET 300 is also minimized. Additionally, because a laser thermal process is used for activating the drain and source dopant for formation of the drain and source extensions 322 and 324 of the MOSFET 300 of the present invention, the drain and source extensions 322 and 324 may be shallow and abrupt junctions having a relatively high concentration of dopant such that the dimensions of the MOSFET 300 may effectively be further scaled down.

The foregoing is by way of example only and is not intended to be limiting. For example, any specified thickness of any structure described herein is by way of example only. Furthermore, as will be understood by those skilled in the art, the structures described herein may be made or used in the same way regardless of their position and orientation. Accordingly, it is to be understood that terms and phrases such as "top," 44 sidewall, and "bottom" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating shallow and abrupt drain and source extensions of a field effect transistor within an active device area of a semiconductor substrate, the method including the steps of:

(A) forming a drain amorphous region by implanting a neutral species into a drain region of said field effect transistor at an angle directed toward a gate of said field effect transistor such that said drain amorphous region is a trapezoidal shape that extends to be sufficiently under said gate of said field effect transistor;

(B) forming a source amorphous region by implanting said neutral species into a source region of said field effect transistor at an angle directed toward said gate of said field effect transistor such that said source amorphous region is a trapezoidal shape that extends to be sufficiently under said gate of said field effect transistor;

(C) implanting a drain and source dopant into said drain amorphous region at an angle directed toward said gate of said field effect transistor;

(D) implanting said drain and source dopant into said source amorphous region at an angle directed toward said gate of said field effect transistor;

wherein said drain and source dopant implanted into said drain and source amorphous regions is contained within said drain and source amorphous regions after said steps C and D; and (E) applying a laser beam to said drain amorphous region and said source amorphous region such that said drain and source dopant are activated within said drain amorphous region and said source amorphous region in a laser thermal process;

wherein said drain extension is formed by said activation of said drain and source dopant in said drain amorphous region during said laser thermal process;

and wherein said source extension is formed by said activation of said drain and source dopant in said source amorphous region during said laser thermal process.

2. The method of claim 1, further including the step of:

forming a spacer on sidewalls of said gate of said field effect transistor, said spacer covering said drain region and said source region of said field effect transistor;

implanting a contact dopant into exposed portions of said active device area of said semiconductor substrate to form a drain contact junction and a source contact junction of said field effect transistor;

activating said contact dopant in said drain contact junction and said source contact junction using a RTA (Rapid Thermal Anneal) process; and etching said spacer on said sidewalls of said gate of said field effect transistor to expose said drain region and said source region before said step A.

3. The method of claim 2, further including the step of:

forming suicides within said drain contact junction, said source contact junction, and said gate of said field effect transistor after said step E.

4. The method of claim 2, wherein said spacer is comprised of silicon nitride (SiN), and wherein spacer liner oxide is deposited between said spacer and said sidewalls of said field effect transistor, and wherein said spacer liner oxide remains on said sidewalls of said field effect transistor after said step of etching said spacer.

5. The method of claim 2, wherein said RTA process is performed at a temperature in a range of approximately 1050° Celsius to 1100° Celsius.

6. The method of claim 1, wherein a depth of implantation of said drain and source dopant into each of said drain amorphous region and said source amorphous region is less than half of a depth of each of drain amorphous region and said source amorphous region respectively.

7. The method of claim 1, wherein said angle of implanting said neutral species for forming said drain amorphous region is in a range of approximately 30° to 60° with respect to an axis that is perpendicular to the surface of said semiconductor substrate.

8. The method of claim 1, wherein said angle of implanting said neutral species for forming said source amorphous region is in a range of approximately 30° to 60° with respect to an axis that is perpendicular to the surface of said semiconductor substrate.

9. The method of claim 1, wherein said angle of implanting said drain and source dopant into said drain amorphous region is in a range of approximately 30° to 60° with respect to an axis that is perpendicular to the surface of said semiconductor substrate.

10. The method of claim 1, wherein said angle of implanting said drain and source dopant into said source amorphous region is in a range of approximately 30° to 60° with respect to an axis that is perpendicular to the surface of said semiconductor substrate.

11. The method of claim 1, wherein said field effect transistor is a MOSFET (Metal Oxide Semiconductor Field Effect Transistor).

12. The method of claim 11, wherein said drain and source dopant is comprised of an N-type dopant for fabricating an NMOSFET (N-channel Metal Oxide Semiconductor Field Effect Transistor).

13. The method of claim 11, wherein said drain and source dopant is comprised of a P-type dopant for fabricating a PMOSFET (P-channel Metal Oxide Semiconductor Field Effect Transistor).

14. A method for fabricating shallow and abrupt drain and source extensions of a MOSFET (Metal Oxide Semiconductor Field Effect Transistor) within an active device area of a semiconductor substrate, the method including the steps of:

(A) forming a spacer on sidewalls of a gate of said MOSFET, said spacer covering a drain region and a source region of said MOSFET;

(B) implanting a contact dopant into exposed portions of said active device area of said semiconductor substrate to form a drain contact junction and a source contact junction of said MOSFET;

(C) activating said contact dopant in said drain contact junction and said source contact junction using a RTA (Rapid Thermal Anneal) process, wherein said RTA process is performed at a temperature in a range of approximately 1050° Celsius to 1100° Celsius;

(D) etching said spacer on said sidewalls of said gate of said MOSFET to expose said drain region and said source region;

and wherein said spacer is comprised of silicon nitride (SiN), and wherein spacer liner oxide is deposited between said spacer and said sidewalls of said MOSFET, and wherein said spacer liner oxide remains on said sidewalls of said MOSFET after said step of etching said spacer;

(E) forming a drain amorphous region by implanting a neutral species into said drain region of said MOSFET at an angle directed toward said gate of said MOSFET such that said drain amorphous region is a trapezoidal shape that extends to be sufficiently under said gate of said MOSFET;

(F) forming a source amorphous region by implanting said neutral species into a source region of said MOSFET at an angle directed toward said gate of said MOSFET such that said source amorphous region is a trapezoidal shape that extends to be sufficiently under said gate of said MOSFET;

and wherein said angle of implanting said neutral species for forming said drain amorphous region and said source amorphous region is in a range of approximately 30° to 60° with respect to an axis that is perpendicular to the surface of said semiconductor substrate;

(G) implanting a drain and source dopant into said drain amorphous region at an angle directed toward said gate of said MOSFET;

(H) implanting said drain and source dopant into said source amorphous region at an angle directed toward said gate of said MOSFET;

and wherein said drain and source dopant is one of an N-type dopant for fabrication of an NMOSFET (N-channel Metal Oxide Semiconductor Field Effect Transistor) and of a P-type dopant for fabrication of a PMOSFET (P-channel Metal Oxide Semiconductor Field Effect Transistor);

and wherein said drain and source dopant implanted into said drain and source amorphous regions is contained within said drain and source amorphous regions after said steps C and D;

and wherein a depth of implantation of said drain and source dopant into each of said drain amorphous region and said source amorphous region is less than half of a depth of each of said drain amorphous region and said source amorphous region respectively;

and wherein said angle of implanting said drain and source dopant into said drain amorphous region and said source amorphous region is in a range of approximately 30° to 60° with respect to said axis that is perpendicular to the surface of said semiconductor substrate;

(I) applying a laser beam to said drain amorphous region and said source amorphous region such that said drain and source dopant are activated within said drain amorphous region and said source amorphous region in a laser thermal process;

and wherein said drain extension is formed by said activation of said drain and source dopant in said drain amorphous region during said laser thermal process;

and wherein said source extension is formed by said activation of said drain and source dopant in said source amorphous region during said laser thermal process; and (J) forming suicides with said drain contact junction, said source contact junction, and said gate of said MOSFET.

* * * * *